United States Patent
Lee et al.

(10) Patent No.: US 9,018,618 B1
(45) Date of Patent: Apr. 28, 2015

(54) SEMICONDUCTOR LIGHT EMITTING DEVICE

(71) Applicant: Samsung Electronics Co., Ltd., Suwon-si, Gyeonggi-do (KR)

(72) Inventors: Jong Hyun Lee, Seoul (KR); Ki Ho Park, Hwaseong-si (KR); Suk Ho Yoon, Seoul (KR); Sang Heon Han, Suwon-si (KR); Jae Sung Hyun, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/526,274

(22) Filed: Oct. 28, 2014

(30) Foreign Application Priority Data

Jan. 16, 2014 (KR) .................. 10-2014-0005568

(51) Int. Cl.
| | | |
|---|---|---|
| *H01L 29/06* | (2006.01) | |
| *H01L 33/00* | (2010.01) | |
| *H01L 33/06* | (2010.01) | |
| *H01L 33/32* | (2010.01) | |

(52) U.S. Cl.
CPC .......... *H01L 33/0025* (2013.01); *H01L 33/06* (2013.01); *H01L 33/32* (2013.01); *H01L 33/325* (2013.01)

(58) Field of Classification Search
CPC ............. H01L 2924/00; H01L 2224/48091; H01L 2924/0002; H01L 33/06; H01L 33/32; H01L 33/0075; H01L 33/60; H01L 33/62; H01L 2924/00014; H01L 33/005; H01L 33/22; H01L 2924/13062; H01L 2933/0041

USPC .......... 257/13–14, 94, 103, E33.008; 438/22, 438/28
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| KR | 10-0910476 B1 | 8/2009 |
| KR | 10-2013-0063730 A | 6/2013 |

*Primary Examiner* — Mark A Laurenzi
(74) *Attorney, Agent, or Firm* — McDermott Will & Emery LLP

(57) ABSTRACT

There is provided a semiconductor light emitting device including: an n-type semiconductor layer; a p-type semiconductor layer; and an active layer disposed between the n-type semiconductor layer and the p-type semiconductor layer, and including a plurality of alternately stacked quantum barrier layers and quantum well layers, wherein at least a portion of the plurality of quantum well layers has different thicknesses, wherein a thickness of a first quantum well layer most adjacent to the p-type semiconductor layer is less than a thickness of a second quantum well layer adjacent thereto and greater than a thickness of a third quantum well layer, other than the first and second quantum well layers.

20 Claims, 15 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,884,351 B2 | 2/2011 | Kyono et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0315180 A1 | 12/2008 | Kim et al. |
| 2011/0121259 A1 | 5/2011 | Han et al. |
| 2011/0187294 A1 | 8/2011 | Bergmann et al. |
| 2012/0286237 A1 | 11/2012 | Nago et al. |
| 2013/0146840 A1 | 6/2013 | Han et al. |
| 2013/0168637 A1 | 7/2013 | Teranishi et al. |

SEMICONDUCTOR LIGHT EMITTING DEVICE

CROSS-REFERENCE TO RELATED APPLICATION

This application claims the benefit of Korean Patent Application No. 10-2014-0005568 filed on Jan. 16, 2014, with the Korean Intellectual Property Office, the disclosure of which is incorporated herein by reference.

BACKGROUND

The present disclosure relates to a semiconductor light emitting device.

In general, a nitride semiconductor has been widely used in green and blue light emitting diodes (LEDs) as well as in laser diodes provided as light sources in full-color displays, image scanners, various signaling systems, or in optical communications devices. Nitride semiconductor light emitting devices may be provided as light emitting devices having an active layer emitting light of various colors, including blue and green, through the recombination of electrons and holes.

The utilization of nitride light emitting devices has been expanded into new areas, such that nitride semiconductor light emitting devices have been actively studied for the purposes of general illumination devices, as well as for light sources in electronic devices, and recently, light sources in high current and high output fields. Thus, research into improving the luminous efficiency and quality of semiconductor light emitting devices has been actively conducted and, in particular, of semiconductor layer structures aimed at improving the quantum efficiency of light emitting devices have been proposed.

SUMMARY

An aspect of the present disclosure may provide a semiconductor light emitting device having improved luminance by enhancing internal quantum efficiency.

According to an aspect of the present disclosure, a semiconductor light emitting device may include: an n-type semiconductor layer; a p-type semiconductor layer; and an active layer disposed between the n-type semiconductor layer and the p-type semiconductor layer, and including a plurality of alternately stacked quantum barrier layers and quantum well layers, wherein at least a portion of the plurality of quantum well layers has different thicknesses, and wherein a thickness of a first quantum well layer most adjacent to the p-type semiconductor layer is less than a thickness of a second quantum well layer adjacent to the first quantum well layer and greater than a thickness of a third quantum well layer, other than the first and second quantum well layers.

The third quantum well layer may be a plurality of third quantum well layers, and thicknesses of each of the plurality of third quantum well layers may be increased in a direction toward the p-type semiconductor layer.

The plurality of quantum barrier layers and the plurality of quantum well layers may form m number of pairs (where m is an integer equal to or greater than 2).

When m is an odd number, an ((m−1)/2)th pair of quantum well and quantum barrier layers from the n-type semiconductor layer may have a minimum thickness difference, and when m is an even number, a (m/2)th pair of quantum well and quantum barrier layers from the n-type semiconductor layer may have a minimum thickness difference.

When m is an odd number, the quantum barrier layer and quantum well layer formed the ((m−1)/2)th pair from the n-type semiconductor have a substantially equal thickness each other, and when m is an even number, the quantum barrier layer and quantum well layer formed the (m/2)th pair from the n-type semiconductor layer have a substantially equal thickness each other.

A thickness ratio of each of the quantum well layers and quantum barrier layers forming the m number of pairs may range from 0.5 to 1.8.

A difference between a maximum value and a minimum value of thicknesses of each of the plurality of quantum well layers range from 0.7 nm to 3.0 nm.

The semiconductor light emitting device further comprises a superlattice layer disposed between the active layer and the n-type semiconductor layer.

The plurality of quantum well layers and the plurality of quantum barrier layers may be formed of $Al_xIn_yGa_{1-x-y}N$ ($0 \le x < 1$, $0 < y \le 1$).

Compositions of indium (In) of the plurality of quantum well layers may be gradually increased from the n-type semiconductor layer in the lamination direction.

An amount of indium (In) in the first quantum well layer may be smaller than or equal to that of the second quantum well layer and greater than or equal to that of the third quantum well layer.

Thicknesses of each of the plurality of quantum barrier layers may be substantially equal.

The p-type semiconductor layer is doped with a p-type impurity including at least one of magnesium (Mg) and zinc (Zn).

According to another aspect of the present disclosure, a semiconductor light emitting device may include: an n-type semiconductor layer; an active layer disposed on the n-type semiconductor layer and including m number of pairs formed by a plurality of alternately stacked quantum well layers and quantum barrier layers; and a p-type semiconductor layer disposed on the active layer, wherein when m is an odd number, an ((m−1)/2)th pair of quantum well and quantum barrier layers from the n-type semiconductor layer may have a minimum thickness difference, and when m is an even number, (m/2)th pair of quantum well and quantum barrier layers from the n-type semiconductor layer may have a minimum thickness difference.

A thickness of a quantum well layer included in an mth pair from the n-type semiconductor layer is smaller than or equal to a thickness of a quantum well layer included in an (m−1)th pair from the n-type semiconductor layer or greater than or equal to a thickness of a quantum well layer included in (m−2)th pair from the n-type semiconductor layer.

According to another aspect of the present disclosure, a semiconductor light emitting device includes an n-type semiconductor layer; a p-type semiconductor layer; and an active layer disposed between the n-type semiconductor layer and the p-type semiconductor layer, and including alternately stacked quantum barrier layers and quantum well layers. Thickness of the quantum well layers increases in a direction away from the n-type semiconductor layer and toward the p-type semiconductor layer.

The above general aspect may include one or more of the following features. A composition of indium included in the quantum well layers may increase in the direction away from the n-type semiconductor layer and toward the p-type semiconductor layer. A first quantum well layer most adjacent to the p-type semiconductor layer may have a thickness less than a thickness of a second quantum well layer adjacent to the first quantum well layer and greater than a thickness of a third quantum well layer, other than the first and second quantum well layers.

the quantum barrier layers and the quantum well layers may form m number of pairs, where m is an integer equal to or greater than 2. When m is an odd number, an ((m−1)/2)th pair of quantum well and quantum barrier layers from the n-type semiconductor layer may have a minimum thickness difference. When m is an even number, an (m/2)th pair of quantum well and quantum barrier layers from the n-type semiconductor layer may have a minimum thickness difference.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
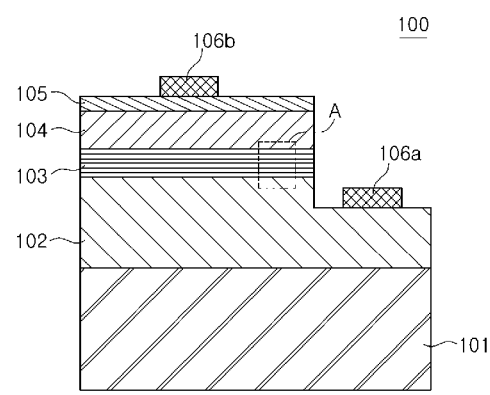
FIG. 1 is a cross-sectional view schematically illustrating a semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view schematically illustrating a semiconductor light emitting device according to an exemplary embodiment of the present disclosure.

Figure 2:
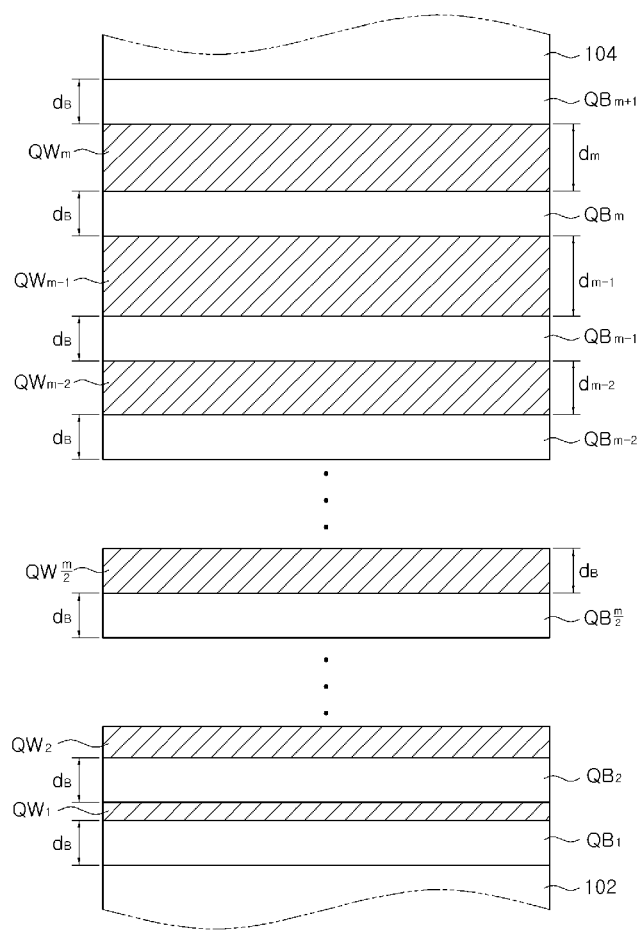
FIG. 2 is an enlarged view of an active layer employable in the semiconductor light emitting device of FIG. 1.

FIG. 2 is an enlarged view of an active layer employable in the semiconductor light emitting device of FIG. 1. In detail, FIG. 2 is an enlarged view of a region 'A' of FIG. 1.

Referring to FIG. 1, the semiconductor light emitting device 100 according to the present exemplary embodiment includes a substrate 101, an n-type semiconductor layer 102, an active layer 103, a p-type semiconductor layer 104, and an ohmic-electrode layer 105. First and second electrodes 106a and 106b may respectively be formed on upper surfaces of the n-type semiconductor layer 102 and the ohmic-electrode layer 105. Merely, in the present disclosure, terms such as 'upper portion', 'upper surface', 'lower portion', 'lower surface', 'lateral surface', and the like, are determined based on the drawings, and in actuality, the terms may be changed according to a direction in which a device is disposed.

The substrate 101 may be provided as a semiconductor growth substrate and may be formed of an insulating, a conductive, or a semiconductive material such as sapphire, Si, SiC, $MgAl_2O_4$, MgO, $LiAlO_2$, $LiGaO_2$, GaN, or the like. A sapphire substrate is a crystal having Hexa-Rhombo Ric symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the C-plane of the sapphire substrate is commonly used as a nitride growth substrate. However, in the case in which a nitride thin film is grown on the C-plane, a strong electric field may be formed in the nitride thin film due to a piezoelectric effect. Meanwhile, in a case in which the substrate 101 is formed of silicon (Si), which is relatively low in price, it may be more appropriate for increasing a diameter of the substrate 101 to facilitate mass-production.

The n-type and p-type semiconductor layers 102 and 104 may be formed of a nitride semiconductor, e.g., a material having a composition of $Al_xIn_yGa_{1-x-y}N$ (0≤x≤1, 0≤y≤1, 0≤x+y≤1). Each of the semiconductor layers 102 and 104 may be configured as a single layer or may include a plurality of layers having different characteristics such as different doping concentrations, compositions, and the like. Here, the n-type and p-type semiconductor layers 102 and 104 may be formed of an AlInGaP or AlInGaAs semiconductor, besides a nitride semiconductor. The active layer 103, disposed between the n-type and p-type semiconductor layers 102 and 104, emits light having a certain level of energy according to the recombination of electrons and holes and may have a multi-quantum well (MQW) structure in which quantum well layers and quantum barrier layers are alternately laminated. For example, in the case of the nitride semiconductor, the multi-quantum well structure may have a GaN/InGaN. A single quantum well (SQW) structure may also be used as needed.

Meanwhile, the n-type and p-type semiconductor layers 102 and 104 and the active layer 103 may be grown using a process known in the art, such as metal-organic chemical vapor deposition (MOCVD), hydride vapor phase epitaxy (HVPE), molecular beam epitaxy (MBE), or the like. Also, although not shown, a buffer layer capable of alleviating stress acting on the n-type semiconductor layer 102 to enhance crystallinity may be formed on the substrate 101 in advance before the n-type semiconductor layer 102 is formed.

As described above, the active layer 103 may have a multi-quantum well (MQW) structure in which a plurality of quantum well layers and a plurality of quantum barrier layers are alternately stacked. In this case, the quantum barrier layers may be formed of a material having a composition of GaN, and the quantum well layers may be formed of a material having a composition of InGaN. Meanwhile, compositions of indium (In) included in each of the plurality of quantum well layers may be different, and this will be described hereinafter.

Referring to FIG. 2, the active layer 103 may include a total of m (where m is an integer equal to or greater than 2) pairs of quantum well layers QW1 to QWm and m+1 quantum barrier layers QB1 to QBm+1. The quantum barrier layers QB1 and QBm+1 are respectively disposed on an interface between the active layer 103 and the n-type semiconductor layer 102 and on an interface between the active layer 103 and the p-type semiconductor layer 104. Thus, as shown in FIG. 2, the quantum barrier layers QB1 to QBm+1 may include one more layer than the quantum well layers QW1 to QWm. A total m number of pairs of the quantum well layers QWm and the quantum barrier layers QBm, from the interface between the n-type semiconductor layer 102 and the active layer 103 to mth quantum well layer and mth quantum barrier layer QBm, may be formed.

In this case, the quantum well layers QW1 to QWm may have different thicknesses. In particular, a thickness of a first quantum well layer QWm which is disposed in an mth position from the n-type semiconductor layer 102 in a thickness direction may be smaller than a thickness of a second quantum well layer QWm−1 which is disposed in an (m−1)th position from the n-type semiconductor layer 102 and greater than a thickness of each of third quantum well layers QW1 to QWm−2, other than the first and second quantum well layers QWm and QWm−1. By limiting the thickness of the first quantum well layer QWm most adjacent to the p-type semiconductor layer 104 to the foregoing conditions, thermal damage transmitted from the p-type semiconductor layer 104 to the active layer 103 may be minimized. Also, damage that may be done as an element such as magnesium (Mg), zinc (Zn), or the like, included as a p-type impurity in the p-type semiconductor layer 104 is diffused to the active layer 103 may also be prevented or reduced.

Meanwhile, in the operation of the semiconductor light emitting device 100 that generates light as electrons are injected from the n-type semiconductor layer 102 to the active layer 103 and holes are injected from the p-type semiconductor layer 104 to the active layer 103, a transfer speed of electrons is faster than that of holes, and thus, electrons and holes may be combined in a region of the active layer 103 close to the p-type semiconductor layer 104. In the exemplary embodiment of the present disclosure, since a thickness of the first quantum well layer QWm most adjacent to the p-type semiconductor layer 104 is greater than that of each of the third quantum well layers QW1 to QWm−2, electron leakage may be prevented or reduced by the first quantum well layer QWm, and as a result, electron-hole recombination efficiency may be increased to improve luminance of the semiconductor light emitting device.

As illustrated in FIG. 2, the quantum well layers QW1 to QWm and the quantum barrier layers QB1 to QBm adjacent to each other within the active layer 103 may form m number of pairs. Thicknesses of the quantum well layers QW1 to QWm may have a tendency increasing in a direction toward the p-type semiconductor layer 104, while thicknesses of the quantum barrier layers QB1 to QBm may be substantially equal. Thus, a difference in thicknesses between the m number of pairs of the quantum well layers QW1 to QWm and the quantum barrier layers QB1 to QBm, each making a pair, may vary. For example, in the first pair of quantum barrier layer QB1 and the quantum well layer QW1 positioned in the lowermost portion of the active layer 103, the thickness of the quantum barrier layer QB1 is greater than the thickness of the quantum well layer QW1, while in the pair of quantum barrier layer QBm and the quantum well layer QWm positioned in an upper portion of the active layer 103, the thickness of the quantum well layer QWm may be smaller than that of the quantum barrier layer QBm.

In the exemplary embodiment of the present disclosure, a pair of quantum well and quantum barrier layers having a minimal thickness difference may be determined on purpose among the quantum well layers QW1 to QWm and the quantum barrier layers QB1 to QBm, by distinguishing between cases in which m is an odd number or an even number. For example, as illustrated in FIG. 2, when m is an even number, a difference in thicknesses between the quantum well layers QW1 to QWm and the quantum barrier layers QB1 to QBm may be smallest in a pair positioned in the (m/2)th from the n-type semiconductor layer 102. Namely, a difference of thicknesses in a pair of a quantum well layer QWm/2 and a quantum barrier layer QBm/2 is smaller than any other pairs. In the case that that m is 10, a difference in thicknesses between the fifth pair of quantum well layer QW5 and quantum barrier layer QB5 may be minimal.

Meanwhile, when m is an odd number, the active layer 103 may be formed such that a difference in thicknesses between a ((m−1)/2)th pair of quantum well and quantum barrier layers from the n-type semiconductor layer 102 is minimized. Namely, in the case that m is 13, a difference in thicknesses between the sixth pair of quantum well layer QW6 and quantum barrier layer QB6 may be smaller than that of other pairs.

By forming the quantum well layers QW1 to QWm and the quantum barrier layers QB1 to QBm to meet the foregoing conditions, in a case in which a large number of quantum well layers QW1 to QWm and quantum barrier layers QB1 to QBm are included in the active layer 103, light output, internal quantum efficiency, droop characteristics, and the like, of the semiconductor light emitting device 100 may be improved. The foregoing effects will be described with reference to graphs of FIGS. 8 to 10. Here, thicknesses of quantum well layers QW1 to QWm and quantum barrier layers QB1 to QBm making pairs whose difference in thicknesses is minimal may be substantially equal. For example, when m is 10, a thicknesses of the fifth quantum well layer QW5 and the fifth quantum barrier layer QB5 are substantially equal each other.

Also, a ratio of thicknesses of the quantum well layers QW1 to QWm and quantum barrier layers QB1 to QBm making m number of pairs may range from 0.5 to 1.8. The limitation in numerical values aims at preventing a degradation of crystallinity of the quantum barrier layers QB1 to QBm during a process of forming the quantum well layers QW1 to QWm including indium (In) and minimizing an influence of piezoelectric polarization that may be generated within the active layer 103. The numerical value limiting conditions may be conditions applied to the entirety of the m number of pairs of the quantum well layers QW1 to QWm and the quantum barrier layers QB1 to QBm included in the active layer 103 regardless of differences in thicknesses.

Meanwhile, a difference between a maximum value and a minimum value of the thicknesses of the plurality of quantum well layers QW1 to QWm may range from 0.7 nm to 3.0 nm. For example, a thickness of the quantum well layer QW1 having the smallest thickness may be 22 Å and a thickness of the quantum well layer QWm−1 having the greatest thickness may be 48 Å. If a difference between the maximum value and the minimum value of the thicknesses of the quantum well layers QW1 to QWm is smaller than a lower limit of the numerical value limiting conditions, thicknesses of the quantum well layers QWm, QWm−1, . . . adjacent to the p-type semiconductor layer 104 are reduced to degrade thin film crystallinity of the active layer 103. Also, if a difference between the maximum value and the minimum value of the thicknesses of the quantum well layers QW1 to QWm is greater than an upper limit of the numerical value limiting conditions, wavelengths of light output from the pairs of quantum well layers QW1 to QWm and the quantum barrier layers QB1 to QBm may vary, so it may be difficult to obtain light having a desired wavelength.

Meanwhile, an n-type superlattice layer may be disposed between the active layer 103 and the n-type semiconductor layer 102. In this case, light having an unintended wavelength, for example, light having a green wavelength, may also be emitted from the n-type superlattice layer. The limitation in numerical values with respect to the maximum value and the minimum value of the quantum well layers QW1 to QWm may be applied as a reference for differentiating between the active layer 103 emitting light having a wavelength intended to be generated and the n-type superlattice layer emitting light having a wavelength generated unintentionally.

Compositions of indium (In) included in the plurality of quantum well layers QW1 to QWm may tend to be gradually increased in a direction away from the n-type semiconductor layer 102. For example, a composition of indium (In) included in ith quantum well layer QWi (i is a positive integer smaller than m) may be smaller than or equal to a composition of indium (In) included in (i+1)th quantum well layer QWi+1 and may be greater than or equal to a composition of indium (In) included in (i−1)th quantum well layer QWi−1. Namely, compositions of indium (In) of respective quantum well layers QW1 to QWm may have tendency similar to that of the thicknesses of the quantum well layers QW1 to QWm which are gradually increased in a direction away from the n-type semiconductor layer 102 and in a direction toward the p-type semiconductor layer 104

Compositions of indium (In) of the respective quantum well layers QW1 to QWm may also have tendency similar to that of the thicknesses of the quantum well layers QW1 to QWm in a region adjacent to the p-type semiconductor layer 104. Namely, an amount of indium (In) in the first quantum well layer QWm most adjacent to the p-type semiconductor layer 104 may be smaller than or equal to an amount of indium (In) in the second quantum well layer QWm−1 and greater than or equal to an amount of indium (In) in each of the third quantum well layers QW1 to QWm−2.

As the composition of indium (In) is increased, band gap energy is reduced, and thus, band gap energy of the first quantum well layer QWm may be greater than or equal to that of the second quantum well layer QWm−1 and smaller than or equal to the third quantum well layer QWm−2. In particular, since band gap energy of the first quantum well layer QWm may be greater than that of the second quantum well layer QWm−1, the first quantum well layer QWm may prevent electrons, which have not been combined with holes in the second quantum well layer QWm−1, from moving out of the active layer 103 so as to be leaked.

Hereinafter, the other components of the semiconductor light emitting device 100 will be described with reference to FIG. 1. The ohmic electrode layer 105 may be formed of a material having ohmic characteristics with respect to the p-type semiconductor layer 104. The ohmic electrode layer 105 may include p-GaN including a p-type impurity whose concentration is higher than that of the p-type semiconductor layer 104. Also, for example, the ohmic electrode layer 105 may be formed of a metal such as Ag, Ni, Al, Rh, Pd, Ir, Ru, Mg, Zn, Pt, Au, or the like, or a transparent conductive oxide such as ITO, CIO, ZnO, or the like. However, the ohmic electrode layer 105 is not essential in the present exemplary embodiment and may be omitted according to circumstances.

The first and second electrodes 106a and 106b may be formed through a process of depositing one or more electro-conductive materials known in the art. The materials may include Ag, Al, Ni, Cr, and the like. However, in the case of the structure illustrated in FIG. 1, the first and second electrodes 106a and 106b are respectively formed on upper surfaces of the n-type semiconductor layer 102 and the ohmic electrode layer 105. The formation scheme of the electrodes 106a and 106b is merely an example and the present disclosure is not limited to the configuration of FIG. 1.

Figure 3:
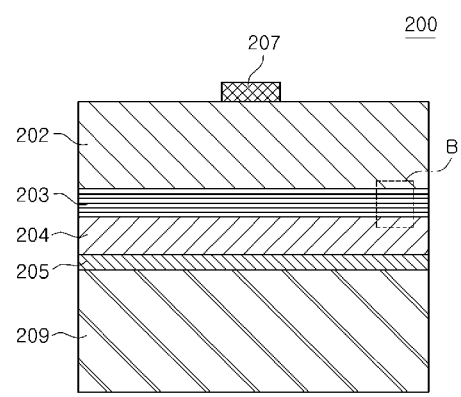
FIG. 3 is a cross-sectional view schematically illustrating a semiconductor light emitting device according to another exemplary embodiment of the present disclosure.

FIG. 3 is a cross-sectional view schematically illustrating a semiconductor light emitting device according to another exemplary embodiment of the present disclosure.

Figure 4:
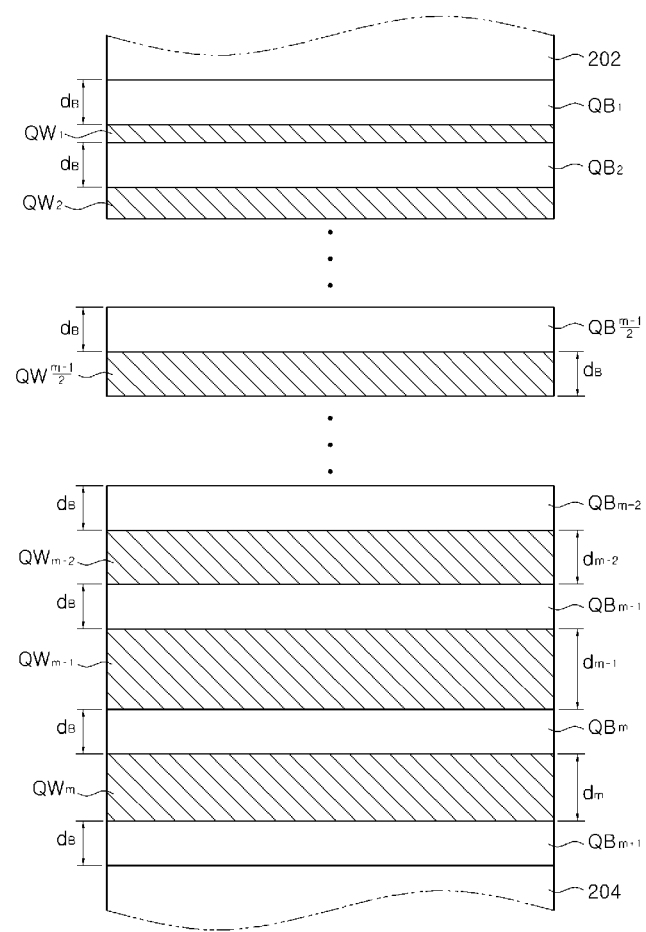
FIG. 4 is an enlarged view of an active layer employable in the semiconductor light emitting device of FIG. 3.

FIG. 4 is an enlarged view of an active layer employable in the semiconductor light emitting device of FIG. 3. Specifically, FIG. 4 is an enlarged view of a region 'B' of FIG. 3.

Referring to FIG. 3, a semiconductor light emitting device 200 according to the present exemplary embodiment includes a light emitting structure formed on a conductive substrate 209, and the light emitting structure includes an n-type semiconductor layer 202, an active layer 203, and a p-type semiconductor layer 204. An n-type electrode 207 may be formed on an upper portion of the n-type semiconductor layer 202, and a reflective metal layer 205 and a conductive substrate 209 may be formed below the p-type semiconductor layer 204.

Hereinafter, region 'B' of FIG. 3, in particular, a structure of the active layer 203 of the semiconductor light emitting device illustrated in FIG. 3 will be described in detail with reference to FIG. 4.

In the present exemplary embodiment, the active layer 203 may include a plurality of quantum well layers QW1 to QWm and a plurality of quantum barrier layers QB1 to QBm+1. Similar to the exemplary embodiment illustrated in FIG. 2, the quantum barrier layers QB1 and QBm+1 are respectively disposed on an interface between the active layer 203 and the n-type semiconductor layer 202 and on an interface between the active layer 203 and the p-type semiconductor layer 204. Also, m number of quantum well layers QW1 to QWm and m number of quantum barrier layers QB1 to QBm sequentially disposed from the interface between the active layer 203 and the n-type semiconductor layer 202 may form m number of pairs.

Referring to FIG. 4, thicknesses of the respective quantum barrier layers QB1 to QBm+1 may be substantially equal. Namely, thicknesses of the respective quantum barrier layers QB1 to QBm+1 of the active layer 203 may be uniformly maintained without a change. Meanwhile, thicknesses of the quantum well layers QW1 to QWm may tend to be gradually increased in a direction away from the interface between the n-type semiconductor layer 202 and the active layer 203.

The thicknesses of the quantum well layers QW1 to QWm may tend to be gradually increased in a direction toward the p-type semiconductor layer 204 from the n-type semiconductor layer 202, but may be different in the active layer 203 region adjacent to the p-type semiconductor layer 204. Namely, a thickness of the first quantum well layer QWm most adjacent to the p-type semiconductor layer 204 may be smaller than that of the second quantum well layer QWm−1 and greater than those of the other third quantum well layers QW1 to QWm−2. By forming the first quantum well layer QWm under the foregoing thickness conditions, a p-type impurity, such as magnesium (Mg), zinc (Zn), or the like, included in the p-type semiconductor layer 204, may be prevented or reduced from being diffused to the active layer 203.

Meanwhile, in the exemplary embodiment of FIG. 4, in a case in which m is an odd number, thicknesses of a ((m−1)/2)th quantum well layer $QW_{(m-1)/2}$ and a ((m−1)/2)th quantum barrier layer $QB_{(m-1)/2}$ making a ((m−1)/2)th pair may be equal. In a case in which m is an even number, thicknesses of a (m/2)th quantum well layer $QW_{m/2}$ and a (m/2)th quantum barrier layer $QB_{m/2}$ may be equal. By forming the active layer 203 in this manner, although m, the number of pairs of the quantum well layers QW1 to QWm and the quantum barrier layers QB1 to QBm+1 included in the active layer, is increased, a degradation of crystallinity may be prevented or reduced.

In addition to the thickness limitation as described above, the quantum well layers QW1 to QWm included in the active layer 203 may have different contents of indium (In). In an exemplary embodiment, compositions of indium (In) of the respective quantum well layers QW1 to QWm may tend to be increased in a direction away from the interface between the n-type semiconductor layer 202 and the active layer 203, namely, in a direction toward the p-type semiconductor layer 204. This is similar to the change in thicknesses of the quantum well layers QW1 to QWm tending to be increased in a direction toward the p-type semiconductor layer 204. Such changes in compositions of indium (In) may result in reducing band gap energy in a direction toward the p-type semiconductor layer 204, thereby hole carrier injection efficiency and diffusion may be increased. Thus, electron-hole recombination efficiency in the active layer 203 may be increased, and thus, a driving voltage may be reduced and luminance may be increased.

Also, as for the indium (In) composition, an amount of indium (In) in the first quantum well layer QWm most adjacent to the p-type semiconductor layer 204 may be smaller than an amount of indium (In) in the second quantum well layer QWm−1 and may be greater than an amount of indium (In) in the third quantum well layers QW1 to QWm−2. As a result, band gap energy of the first quantum well layer QWm may be greater than that of the second quantum well layer QWm−1, and electron leakage caused as electrons and holes injected into the active layer 203 are not combined but leaked may be minimized.

Similar to the exemplary embodiment of FIG. 2, a difference between a greatest thickness and a smallest thickness of the quantum well layers QW1 to QWm of the active layer 204 may be limited to range from 0.7 nm to 3.0 nm. Also, a thickness ratio between the quantum well layers QW1 to QWm and the quantum barrier layers QB1 to QBm making m number of pairs may range from 0.5 to 1.8. The second condition regarding the thickness ratio may be aimed at preventing a degradation of thin film crystallinity of the quantum barrier layers QB1 to QBm that may be caused due to indium (In) during the process of forming the quantum well layers QW1 to QWm. Meanwhile, the first condition regarding a thickness difference may be a condition for more effectively revealing the effect of the present disclosure to lower a driving voltage and increase luminance by enhancing hole injection efficiency.

Referring back to FIG. 3, the reflective metal layer 205 may be formed of a material exhibiting electrically ohmic characteristics with respect to the p-type semiconductor layer 204. The reflective metal layer 205 may be formed of a metal having high reflectivity to reflect light emitted from the active layer 203. In consideration of this function, the reflective metal layer 205 may be formed of a material such as Ag, Ni, Al, Rh, Pd, Ir, Ru, Mg, Zn, Pt, Au, or the like.

The conductive substrate 209 may be connected to an external power source to apply an electrical signal to the p-type semiconductor layer 204. Also, the conductive substrate 209 may be configured to support the light emitting structure during a process such as a laser lift-off (LLO) process for removing the substrate used for semiconductor growth. The conductive substrate 209 may be formed of a material including any one of Au, Ni, Al, Cu, W, Si, Se, and GaAs, for example, a material doped with aluminum (Al) in a silicon substrate. In this case, the conductive substrate 209 may be formed on the reflective metal layer 250 through a process such as plating, sputtering, or the like. Alternatively, a previously manufactured conductive layer 209 may be bonded to the reflective metal layer 205 by the medium of a conductive bonding layer, or the like.

Figure 5:
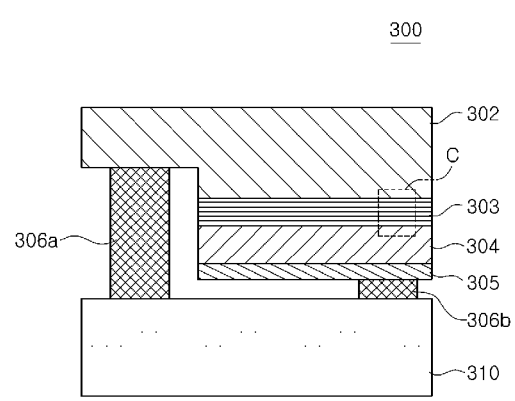
FIG. 5 is a cross-sectional view schematically illustrating a semiconductor light emitting device according to another exemplary embodiment of the present disclosure.

FIG. 5 is a cross-sectional view schematically illustrating a semiconductor light emitting device according to another exemplary embodiment of the present disclosure.

Figure 6:
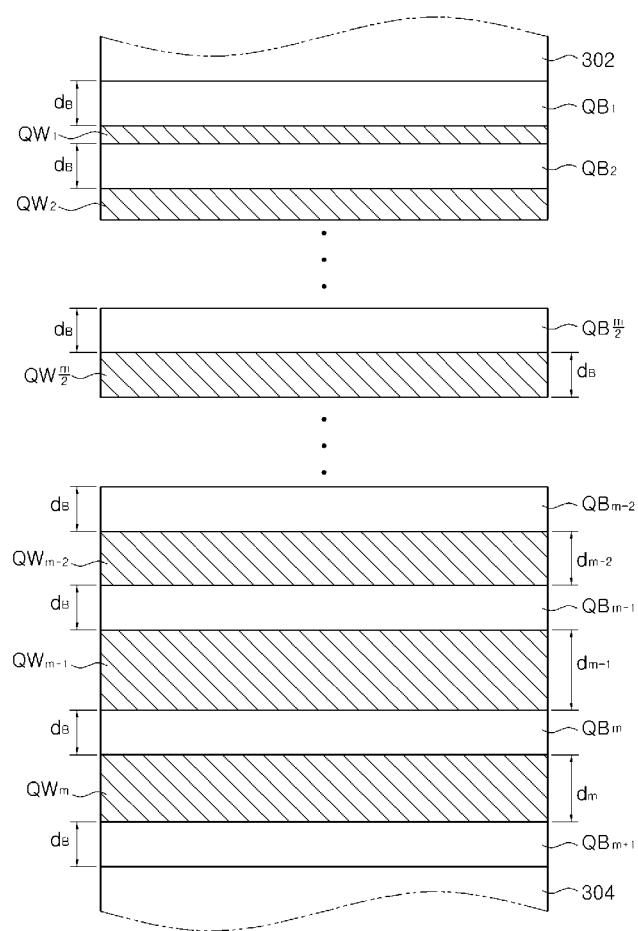
FIG. 6 is an enlarged view of an active layer employable in the semiconductor light emitting device of FIG. 5.

FIG. 6 is an enlarged view of an active layer employable in the semiconductor light emitting device of FIG. 5. Specifically, FIG. 5 is an enlarged view of a region C of FIG. 5.

Referring to FIG. 5, a semiconductor light emitting device 300 according to the present exemplary embodiment includes a light emitting structure disposed on a package board 310, and the light emitting structure may include an n-type semiconductor layer 302, an active layer 303, and a p-type semiconductor layer 304. First and second electrodes 306a and 306b may be formed on lower surfaces of the n-type semiconductor layer 302 and an ohmic electrode layer 305. In the present exemplary embodiment, the semiconductor light emitting device 300 may have a so-called flipchip structure in which the first and second electrodes 306a and 306b are mounted on the package board 310.

Referring also to FIG. 6, the active layer 303 may include a plurality of quantum well layers QW1 to QWm and a plurality of quantum barrier layers QB1 to QBm+1. The plurality of quantum well layers QW1 to QWm and the plurality of quantum barrier layers QB1 to QBm+1 may be sequentially cross-stacked from an interface between the n-type semiconductor layer 302 and the active layer 303, forming a total of m number of pairs. The quantum barrier layers QB1 and QBm+1 may be disposed in an interface between the active layer 303 and the n-type semiconductor layer 3302 and an interface between the active layer 303 and the p-type semiconductor layer 304, respectively.

Thicknesses of the plurality of quantum well layers QW1 to QWm may tend to be gradually increased in a direction toward the p-type semiconductor layer 304 from the n-type semiconductor layer 302. Also, a thickness of the first quantum well layer QWm most adjacent to the p-type semiconductor layer 304 may be smaller than a thickness of the second quantum well layer QWm−1 and greater than thicknesses of other third quantum well layer QW1 to QWm−2. By limiting the thickness of the first quantum well layer QWm in this manner, damage caused as a p-type impurity included in the p-type semiconductor layer is diffused to the active layer 303 and leakage of electrons which have not been combined with holes in the active layer 303 may be reduced.

In the present exemplary embodiment, the quantum well layers QW1 to QWm and the quantum barrier layers QB1 to QBm+1 included in the active layer 303 may have a structure similar to that of the exemplary embodiment of FIG. 2. Thicknesses of the respective quantum barrier layers QB1 to QBm+1 may have a substantially constant value dB, and thicknesses of the quantum well layers QW1 to QWm may be increased in a direction toward the p-type semiconductor layer 304.

In a case in which m corresponding to a number of the quantum well layers QW1 to QWm is an even number, the quantum barrier layers QB1 to QBm+1 may have a predetermined thickness. In this scenario, thicknesses of the quantum well layers QW1 to QWm tend to increase in a direction toward the p-type semiconductor layer 304, and among differences in thicknesses between the quantum well layers QW1 to QWm and the quantum barrier layers QB1 to QBm+1 adjacent thereto, a difference in thicknesses of an (m/2)th pair of quantum well layer and a quantum barrier layer may have a minimum value. According to processing conditions, the (m/2)th quantum well layer $QW_{m/2}$ from the n-type semiconductor layer 302 may have a thickness substantially equal to that of the quantum barrier layer $QB_{m/2}$ adjacent thereto. In the case of forming the active layer 303 to have a large number of pairs based on the foregoing conditions, a degradation of thin film crystallinity may be prevented or reduced.

If it is assumed that m is an odd number, among differences in thicknesses between the quantum well layers QW1 to QWm and the quantum barrier layers QB1 to QBm+1 adjacent thereto, a difference in thicknesses of a ((m−1)/2)th pair of quantum well and quantum barrier layers may have a minimum value. Like the case in which m is an even number, the active layer 303 having a large number of pairs based on the thickness conditions may be easily formed.

In case of increasing the number of laminations of the quantum well layers QW1 to QWm and the quantum barrier layers QB1 to QBm+1 included in the active layer 303, a light output, internal quantum efficiency, and droop characteristics based on heat, and the like, may be improved, but thin film crystallinity may be degraded to rather lower performance. In various exemplary embodiments of the present disclosure, the active layer 303 is formed such that thicknesses of the quantum well layers QW1 to QWm are gradually increased in a direction toward the p-type semiconductor layer 304, and thicknesses of the quantum well layers QW1 to QWm and the quantum barrier layers QB1 to QBm+1 are substantially equal in particular lamination order depending on whether a lamination number m is an odd number or an even number.

Based on lamination order in which thicknesses of the quantum well layers QW1 to QWm and the quantum barrier layers QB1 to QBm+1 are substantially equal, a partial region of the active layer 303 disposed toward the n-type semiconductor layer 302 may serve as a type of seed region, and the remaining portion of the active layer 303 disposed toward the p-type semiconductor layer 304 may serve as a light emitting region. A transfer speed of electrons is faster than that of holes. Thus, based on characteristics of the active layer 303 that the partial region disposed toward the p-type semiconductor layer 304 mainly emits light, the partial region of the active layer 303 disposed toward the n-type semiconductor layer 302 may be utilized as a seed region, thus stabilizing film quality of the active layer 303 and thus enhancing productivity of the semiconductor light emitting device 300.

Hereinafter the other components of the semiconductor light emitting device 300 will be described with reference to FIG. 5. The ohmic electrode layer 305 may be formed of a light reflective material, for example, a highly reflective metal. The ohmic electrode layer may include, for example, materials such as Ag, Ni, Al, Rh, Pd, Ir, Ru, Mg, Zn, Pt, Au, and the like.

The package board 310 may allow a light emitting structure to be mounted thereon, and a circuit board such as a PCB, an MCPCB, an MPCB, an FPCB, a ceramic board such as AlN, $Al_2O_3$, or the like, or a silicon substrate may be provided as the package board 310. Also, the package board 310 may be provided as a lead frame of a package, rather than a board.

Figure 7A:
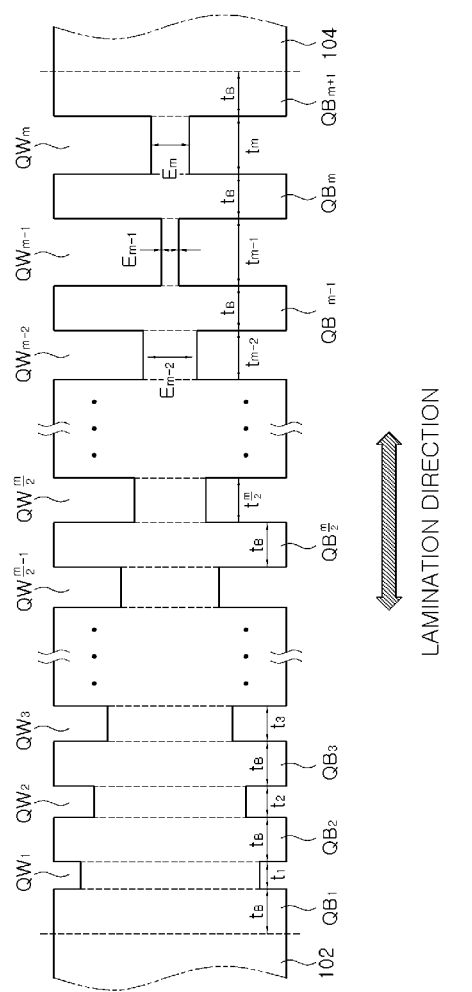
FIGS. 7A and 7B are energy band diagrams of an active layer of a semiconductor light emitting device according to an exemplary embodiment of the present disclosure.
Figure 7B:
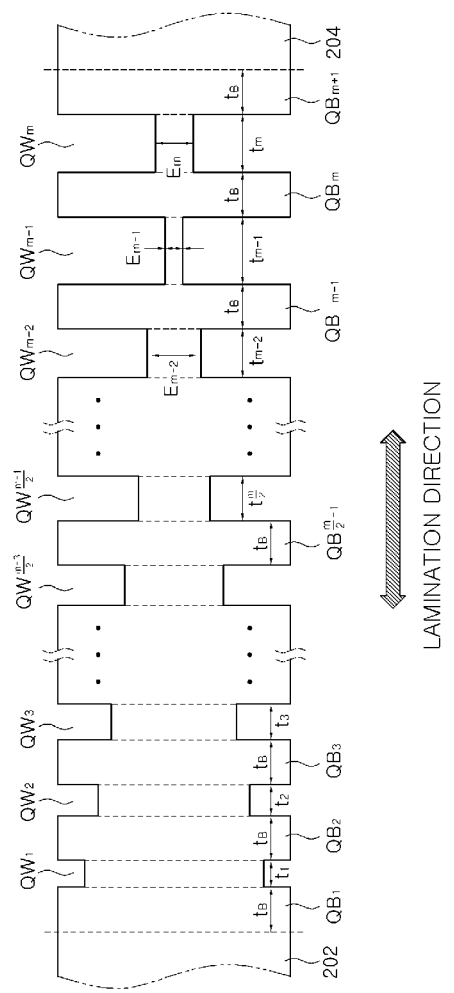

FIGS. 7A and 7B are energy band diagrams of an active layer of a semiconductor light emitting device according to an exemplary embodiment of the present disclosure. Referring to FIGS. 7A and 7B, a lamination direction is shown.

Hereinafter, an energy band diagram of FIG. 7A will be described. The energy band diagram of FIG. 7A may correspond to the active layer 103 or 303 of FIG. 2 or FIG. 6. Hereinafter, for the purposes of description, the active layer 103 of FIG. 2 will be described as an example. Also, band gap energy illustrated in the energy band diagrams of FIGS. 7A and 7B may have been exaggerated for the purposes of description.

Referring to FIG. 7A, the active layer 103 may be disposed between the n-type semiconductor layer 102 and the p-type semiconductor layer 104. The plurality of quantum well layers QW1 to QWm and the plurality of quantum barrier layers QB1 to QBm+1 may be alternately stacked in the active layer 103. The quantum barrier layers QB1 and QBm+1 may respectively be disposed on the interface between the n-type semiconductor layer 102 and the active layer 103 and the interface between the active layer 103 and the p-type semiconductor layer 104. The alternately stacked quantum well layers QW1 to QWm and the quantum barrier layers QB1 to QBm+1 may form m number of pairs. Namely, in FIG. 7, m number of quantum barrier layers QB1 to QBm, excluding the quantum barrier layer QBm+1 disposed on the interface between the active layer 103 and the p-type semiconductor layer 104, may form m number of pairs with the quantum well layers QW1 to QWm adjacent thereto in the lamination direction.

As illustrated in FIG. 7A, all of the thicknesses of the plurality of quantum barrier layers QB1 to QBm+1 may have the same value $t_B$ regardless of the lamination direction. Here, wording that the thicknesses of the plurality of quantum barrier layers QB1 to QBm+1 have the same value may be understood as that the respective quantum barrier layers QB1 to QBm+1 have a substantially same thickness in consideration of thickness variations that may be caused due to a processing order, or the like.

Meanwhile, thicknesses of the plurality of quantum well layers QW1 to QWm may tend to be gradually increased in a direction away from the n-type semiconductor layer 102, namely, in a direction toward the p-type semiconductor layer 104. The quantum well layer QW1 most adjacent to the n-type semiconductor layer 102 may have a smallest thickness. Thus, in a partial region of the active layer 103 adjacent to the n-type semiconductor layer 102, partial quantum well layers may be thinner than partial quantum barrier layers, and in a partial region of the active layer 103 adjacent to the p-type semiconductor layer 104, partial quantum well layers may be thicker than partial quantum barrier layers.

Thus, a difference in thicknesses between the quantum well layers QW1 to QWm and the quantum barrier layers QB1 to QBm may be smallest in a central portion of the active layer 103 in the lamination direction. In FIG. 7A, among the difference in thicknesses between the quantum well layers QW1 to QWm and the quantum barrier layers QB1 to QBm forming m number of pairs, a difference in thicknesses of the (m/2)th pair of quantum well layer and the quantum barrier layer from the n-type semiconductor layer 102 may be smallest. In this case, m is an even number and the thickness $t_{m/2}$ of the quantum well layer $QW_{m/2}$ and the thickness $t_B$ of the quantum barrier layer $QB_{m/2}$ have smallest difference and may be substantially equal. By forming the quantum well layers QW1 to QWm and the quantum barrier layers QB1 to QBm such that a difference in thicknesses of the (m/2)th pair of quantum well layer and the quantum barrier layer is minimized in the case that m is an even number, a large number of quantum well layers QW1 to QWm and the quantum barrier layers QB1 to QBm may be formed without degrading film quality.

Meanwhile, a thickness of the first quantum well layer QWm most adjacent to the p-type semiconductor layer 104 may be smaller than a thickness of the second quantum well layer QWm−1 adjacent to the first quantum well layer QWm in the lamination direction. Also, a thickness of the first quantum well layer QWm may be greater than a thickness of any one of the third quantum well layers QW1 to QWm−2. Referring to FIG. 7A, the thickness $t_m$ of the first quantum well layer QWm may be greater than the thickness $t_{m-2}$ of the quantum well layer QWm−2 having the greatest thickness among the third quantum well layers QW1 to QWm−2. This may be expressed by Equation 1 below.

$$t_{m-2} \leq t_m \leq t_{m-1}$$ [Equation 1]

By forming the quantum well layers QW1 to QWm to have the thicknesses under the conditions as expressed by Equation 1, damage that may be done as the p-type impurity included in the p-type semiconductor layer 104 is diffused to the active layer 103 may be prevented or reduced and electron leakage caused as electrons transmitted from the n-type semiconductor layer 102 are not combined with holes but leaked may be prevented or reduced.

Referring to band gap energy of each of the quantum well layers QW1 to QWm, the band bap energy of the quantum well layers QW1 to QWm may tend to be gradually decreased in a direction toward the p-type semiconductor layer 104. Referring to FIG. 7A, band gap energy $E_m$ of the first quantum well layer QWm most adjacent to the p-type semiconductor layer 104 may be greater than band gap energy $E_{m-1}$ of the second quantum well layer QWm−1 and smaller than band gap energy of one of the third quantum well layers QW1 to Qwm−2. In FIG. 7A, band gap energy $E_{m-2}$ of the quantum well layer QWm−2 adjacent to the second quantum well layer QWm−1 in the lamination direction may be a smallest among band gap energy of the third quantum well layers QW1 to QWm−2, and the band gap energy $E_m$ of the first quantum well layer QWm may be smaller than $E_{m-2}$.

The difference in the band gap energy may appear by differentiating the compositions of indium (In) included in the respective quantum well layers QW1 to QWm. As the content of indium (In) is increased, band gap energy is reduced. Thus, the foregoing characteristics may be obtained by adjusting the content of indium (In) of the first quantum well layer QWm to be smaller than that of the second quantum well layer QWm−1 and greater than that of any one of the third quantum well layers QW1 to QWm−2. As described above, hole injection efficiency and diffusion may be improved by adjusting the compositions of indium (In) and thicknesses of the quantum well layers QW1 to QWm, whereby electron-hole recombination efficiency of the active layer 103 may be increased to lower a driving voltage and increase luminance (light output).

Hereinafter, an energy band diagram of FIG. 7B will be described. The energy band diagram of FIG. 7B may correspond to the active layer 203 of FIG. 4.

Referring to FIG. 7B, similar to the case of FIG. 7, thicknesses $t_B$ of the quantum barrier layers QB1 to QBm+1 may be substantially equal without a variation. Thicknesses tm of the quantum well layers QW1 to QWm may be gradually increased in a direction away from the n-type semiconductor layer 202 and in a direction toward the p-type semiconductor layer 204, and a thickness of the first quantum well layer QWm most adjacent to the p-type semiconductor layer 204 may be smaller than that of the second quantum well layer QWm−1 adjacent thereto in the lamination direction. Also, the thickness of the first quantum well layer QWm may be greater than that of any one of the third quantum well layers QW1 to QWm−2.

Band gap energy may have a distribution similar to that of FIG. 7A. Band gap energy of the quantum well layers QW1 to QWm is gradually decreased toward the p-type semiconductor layer 204, and band gap energy $E_m$ of the first quantum well layer QWm may be greater than band gap energy $E_{m-1}$ of the second quantum well layer QWm−1 adjacent thereto in the lamination direction. Also, the band gap energy $E_m$ of the first quantum well layer QWm may be smaller than a smallest value $E_{m-2}$ among band gap energy values of the third quantum well layers QW1 to QWm−2.

In FIG. 7B, unlike the case of FIG. 7A, it is assumed that m, a number of pairs of quantum well layers QW1 to QWm and the quantum barrier layers QB1 to QBm, is an odd number, and thus, a difference in thicknesses of the ((m−1/2)th pair of quantum well layer $QW_{(m-1)/2}$ and the quantum barrier layer $QB_{(m-1)/2}$ from the n-type semiconductor layer 202 may have a minimum value. Like the case of FIG. 7A as described above, since the active layer 203 is formed according to the foregoing thickness and band gap energy conditions, introduction of a p-type impurity that may be diffused from the p-type semiconductor layer 204 may be minimized, electron leakage may be prevented or reduced, and hole injection efficiency and diffusion may be improved to lower a driving voltage and increase luminance.

Figure 8:
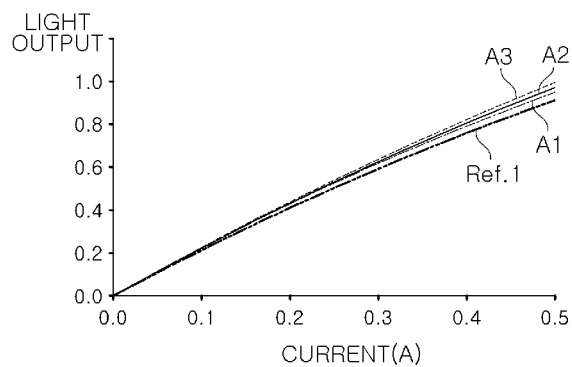
FIGS. 8 through 10 are graphs illustrating characteristics of a semiconductor light emitting device according to an exemplary embodiment of the present disclosure.
Figure 9:
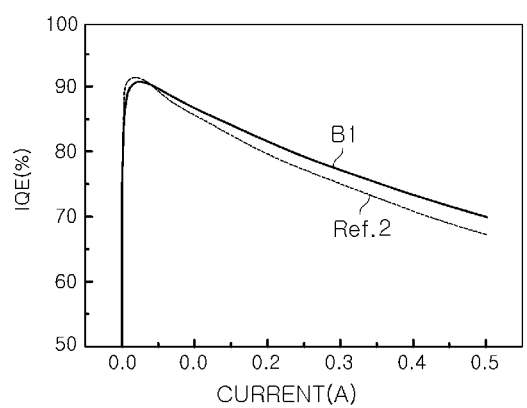
Figure 10:
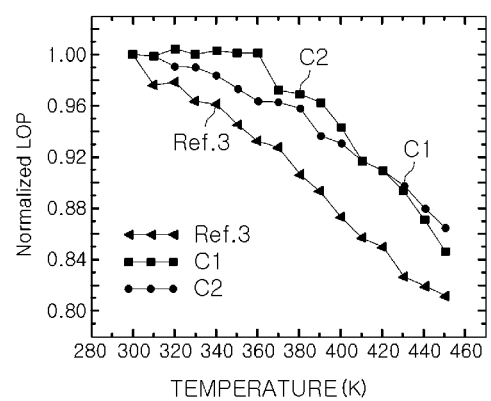

FIGS. 8 through 10 are graphs illustrating characteristics of a semiconductor light emitting device according to an exemplary embodiment of the present disclosure;

FIG. 8 is a graph illustrating a light output over current. Referring to FIG. 8, a total of four curves (or graphs) are illustrated. The four curves illustrated in FIG. 8 include a graph illustrating light output of a comparative example Ref.1 as a reference and curves corresponding light outputs according to embodiment examples A1 to A3.

The comparative example Ref.1 represents a light output over current measured in a semiconductor light emitting device not including the active layer according to various exemplary embodiments of the present disclosure, and the embodiment examples A1 to A3 represent light outputs over current measured in the semiconductor light emitting devices including the active layers according various exemplary embodiments of the present disclosure. In the graphs of FIG. 8, components such as a substrate, an n-type semiconductor layer, a p-type semiconductor layer, a p-type contact layer, and the like, excluding an active layer, of the semiconductor light emitting devices corresponding to the comparative example Ref. 1 and the embodiment examples A1 to A3 may be identical.

In particular, the semiconductor light emitting device according to a second embodiment example A2 may further include a pair of quantum well and quantum barrier layers in the active layer, compared to the semiconductor light emitting device according to a first embodiment example A1, and the semiconductor light emitting device according to a third embodiment example A3 may further include two pairs of quantum well layer and quantum barrier layer in the active layer, compared to the semiconductor light emitting device according to the first embodiment example A1. In this case, the active layer included in the semiconductor light emitting device according to the first embodiment example A1 may include quantum well layers and quantum barrier layers corresponding to the amount of those of the semiconductor light emitting device according to the comparative example Ref. 1, while having the characteristics such as thicknesses of quantum well layers, compositions of indium (In), and the like, that follow various exemplary embodiments of the present disclosure.

Referring to FIG. 8, the semiconductor light emitting devices according to the embodiment examples A1 to A3 may exhibit relatively high light outputs over the same amount of current, compared to the semiconductor light emitting device according to the comparative example Ref. 1. In particular, as for the semiconductor light emitting devices according to the embodiment examples A1 to A3 employing the exemplary embodiments of the present disclosure, the semiconductor light emitting device further including the two pairs of quantum well layer and quantum barrier layer according to the third Embodiment Example A3 may exhibit higher light output, compared to the semiconductor light emitting devices according to the first and second Embodiment Examples, A1 and A2.

FIG. 9 is a graph illustrating internal quantum efficiency over current. Referring to FIG. 9, it can be seen that the semiconductor light emitting device according to an embodiment example B1 has relatively high internal quantum efficiency over most current values, compared to the semiconductor light emitting device according to a comparative example Ref. 2 without using the active layers according to various exemplary embodiments of the present disclosure.

In FIG. 9, the semiconductor light emitting device according to the comparative example Ref. 2 may be a semiconductor light emitting device identical to that according to the comparative example Ref. 1 of FIG. 8. Also, the semiconductor light emitting device according to the embodiment example B1 illustrated in the graph of FIG. 9 may be a semiconductor light emitting device identical to that according to the third embodiment example A3 in FIG. 8. Namely, the semiconductor light emitting device according to the embodiment example B1 in FIG. 9 may include a substrate, an n-type semiconductor layer, a p-type semiconductor layer, and a p-type contact layer identical to those of the semiconductor light emitting device according to the comparative example Ref. 2, and an active layer may be identical to that of the semiconductor light emitting device according to the third embodiment example A3 of FIG. 8.

FIG. 10 is a graph illustrating droop characteristics based on heat generated when the semiconductor light emitting device operates. Referring to FIG. 10, the semiconductor light emitting device according to a comparative example Ref. 3 has droop characteristics that a light output is degraded from a temperature of approximately 300K, while the semiconductor light emitting devices according to embodiment examples C1 and C2 of the present disclosure have droop characteristics appearing at a temperature higher than 300K or have a light output decreased more gently than that of the semiconductor light emitting device according to the comparative example Ref. 3. Meanwhile, in FIG. 10, the semiconductor light emitting devices according to the embodiment examples C1 and C2 may be semiconductor light emitting devices identical to those of the embodiment examples A1 to A3 in the graph of FIG. 8.

Referring to FIG. 10, the semiconductor light emitting device according to a first Embodiment Example C1 may have a droop phenomenon that a light output is reduced from a temperature in the vicinity of approximately 300K, similar to that of the semiconductor light emitting device according to the comparative example Ref. 3, but the reduction in the light output over an increase in temperature may be considerably smaller than that of the semiconductor light emitting device according to the comparative example Ref. 3. Also, the semiconductor light emitting device according to a second comparative example C2 further including two pairs of quantum well layer and quantum barrier layer, compared to the semiconductor light emitting device according to the first embodiment example C1 does not have any droop phenomenon up to a temperature in the vicinity of approximately 360K and a degradation in the light output appearing at a temperature of 360K or higher may be smaller than that of the semiconductor light emitting device according to the comparative example Ref. 3.

Figure 11:
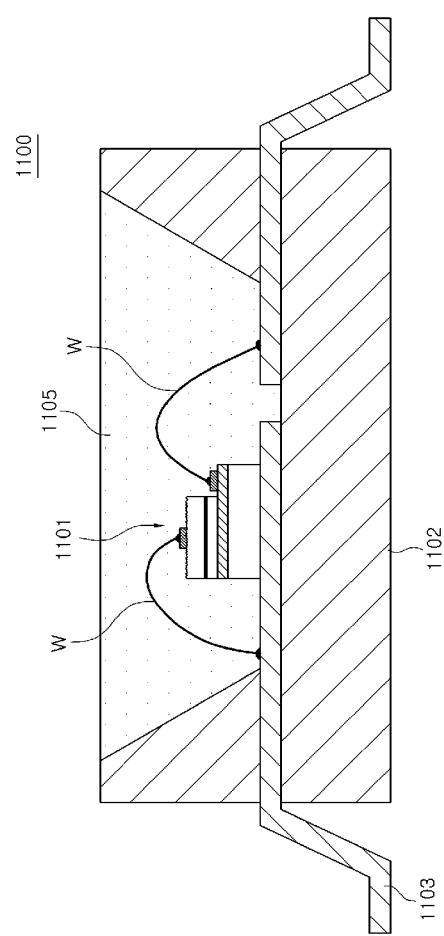
FIGS. 11 and 12 are views illustrating an exemplary application of a semiconductor light emitting device of the present disclosure to a package.
Figure 12:
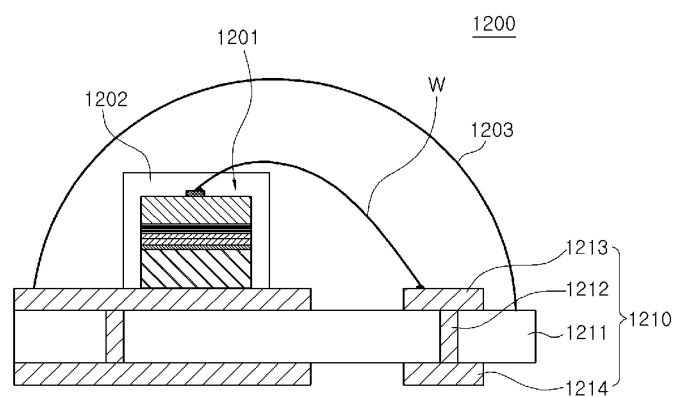

FIGS. 11 and 12 are views illustrating an example of application of a semiconductor light emitting device according to an exemplary embodiment of the present disclosure to a package.

Referring to FIG. 11, a semiconductor light emitting device package 1100 may include a semiconductor light emitting device 1101, a package body 1102, and a pair of lead frames 1103. The semiconductor light emitting device 1101 may be mounted on the lead frame 1103 and electrically connected to the lead frame 1103 through a wire W. According to an exemplary embodiment, the semiconductor light emitting device 1101 may be mounted on a different region, for example, on the package body 1102, rather than on the lead frame 1103. The package body 1102 may have a cup shape to improve reflectivity efficiency of light. An encapsulant 1105 formed of a light-transmissive material may be formed in the reflective cup to encapsulate the semiconductor light emitting device 1101, the wire W, and the like. In the present exemplary embodiment, the semiconductor light emitting device package 1100 is illustrated as including the semiconductor light emitting device 100 illustrated in FIG. 1 but it may also include various other types of semiconductor light emitting device, as well as the semiconductor light emitting devices 200 and 300 illustrated in FIGS. 3 and 5.

Referring to FIG. 12, a semiconductor light emitting device package 1200 may include a semiconductor light emitting device 1201, a mounting board 1210, and an encapsulant 1203. Also, a wavelength conversion unit 1202 may be formed on an upper surface and lateral surfaces of the semiconductor light emitting device 1201. The semiconductor light emitting device 1201 may be mounted on the mounting board 1210 and electrically connected to the mounting board 1210 through a wire W and the conductive substrate 209 (please refer to FIG. 3).

The mounting board 1210 may include a board body 1211, an upper electrode 1213, and a lower electrode 1214. Also, the mounting board 1210 may include a through electrode 1212 connecting the upper electrode 1213 and the lower electrode 1214. The mounting board 1210 may be provided as a board such as PCB, MCPCB, MPCB, FPCB, or the like, and the structure of the mounting board 2010 may be applied to have various forms.

The wavelength conversion unit 1202 may include a phosphor, a quantum do, and the like. The encapsulant 1203 may be formed to have a lens structure with an upper surface having a convex dome shape. However, according to an exemplary embodiment, the encapsulant 1203 may have a lens structure having a convex or concave surface to adjust a beam angle of light emitted through an upper surface of the encapsulant 1203.

In the present exemplary embodiment, the semiconductor light emitting device package 1200 is illustrated as including the semiconductor light emitting device 200 illustrated in FIG. 3, but it may also include various other types of semiconductor light emitting devices, as well as the semiconductor light emitting devices 100 and 300 of FIGS. 1 and 5 according to an exemplary embodiment.

Figure 13:
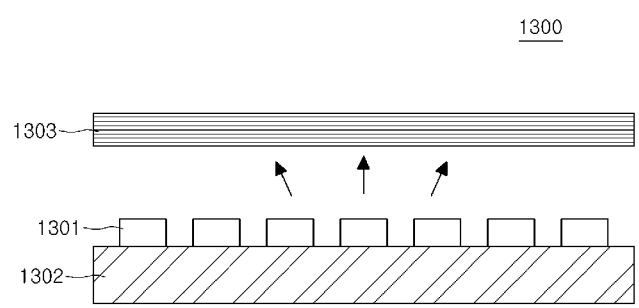
FIGS. 13 and 14 are views illustrating an exemplary application of a semiconductor light emitting device of the present disclosure to a backlight unit.
Figure 14:
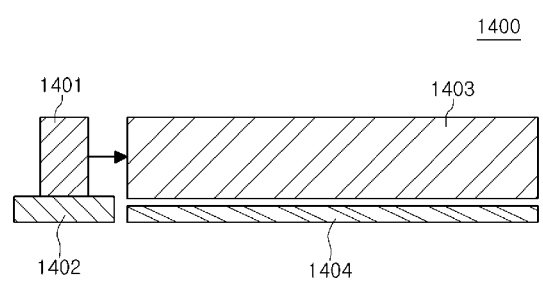

FIGS. 13 and 14 are views illustrating an example of application of a semiconductor light emitting device according to an exemplary embodiment of the present disclosure to a backlight unit.

Referring to FIG. 13, a backlight unit 1300 includes light sources 1301 mounted on a substrate 1302 and one or more optical sheets 1303 disposed above the light sources 1301. The semiconductor light emitting device package having the structure described above with reference to FIGS. 10 and 11 or a structure similar thereto may be used as the light sources 1301. Alternatively, a semiconductor light emitting device may be directly mounted on the substrate 1302 (a so-called COB type) and used.

Unlike the backlight unit 1300 in FIG. 13 in which the light sources 1301 emit light toward an upper side where a liquid crystal display is disposed, a backlight unit 1400 as another example illustrated in FIG. 14 is configured such that a light source 1401 mounted on a substrate 1402 emits light in a lateral direction, and the emitted light may be made to be incident to a light guide plate 1403 so as to be converted into a surface light source. Light, passing through the light guide plate 1403, is emitted upwards, and in order to enhance light extraction efficiency, a reflective layer 1404 may be disposed on a lower surface of the light guide plate 1403.

Figure 15:
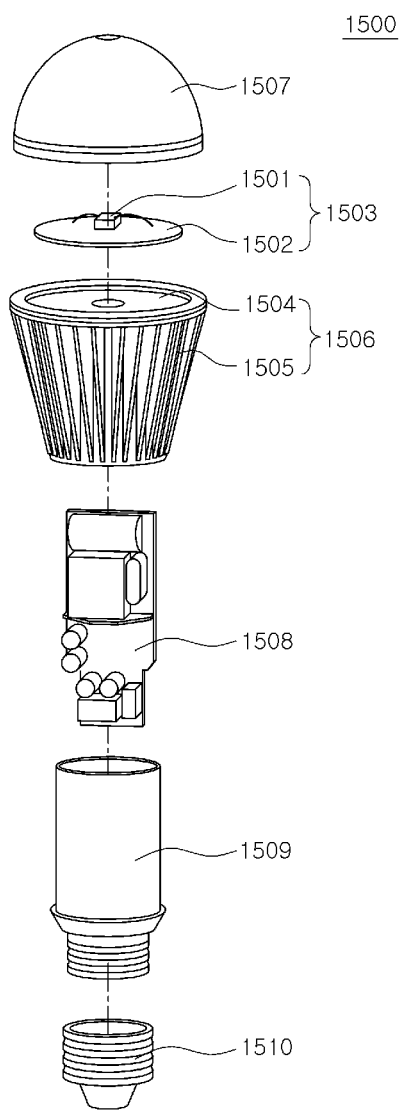
FIG. 15 is a view illustrating an exemplary application of a semiconductor light emitting device of the present disclosure to a lighting device.

FIG. 15 is a view illustrating an example of application of a semiconductor light emitting device according to an exemplary embodiment of the present disclosure to a lighting device.

Referring to the exploded perspective view of FIG. 15, a lighting device 1500 is illustrated as, for example, a bulb-type lamp and includes a light emitting module 1503, a driving unit 1508, and an external connection unit 1510. Also, the lighting device 1500 may further include external structures such as external and internal housings 1506 and 1509 and a cover unit 1507. The light emitting module 1503 may include a semiconductor light emitting device 1501, which may be similar to any of the light emitting devices illustrated in FIGS. 1, 3, and 5, and a circuit board 1502 having the semiconductor light emitting device 1501 mounted thereon. In the present exemplary embodiment, it is illustrated that a single semiconductor light emitting device 1501 is mounted on the circuit board 1502, but a plurality of semiconductor light emitting devices may be installed as needed. Also, the semiconductor light emitting device 1501 may be manufactured as a package and subsequently mounted, rather than being directly mounted on the circuit board 1502.

In the lighting device 1500, the light emitting module 1503 may include the external housing 1506 serving as a heat dissipation unit and the external housing 1506 may include a heat dissipation plate 1504 disposed to be in direct contact with the light emitting module 1503 to enhance heat dissipation. Also, the lighting device 1500 may include the cover unit 1507 installed on the light emitting module 1503 and having a convex lens shape. The driving unit 1508 may be installed in the internal housing 1509 and connected to the external connection unit 1510 having a socket structure to receive power from an external power source. Also, the driving unit 1508 may serve to convert power into an appropriate current source for driving the semiconductor light emitting device 1501 of the light emitting module 1503, and provide the same. For example, the driving unit 1508 may be configured as an AC-DC converter, a rectifying circuit component, or the like.

Figure 16:
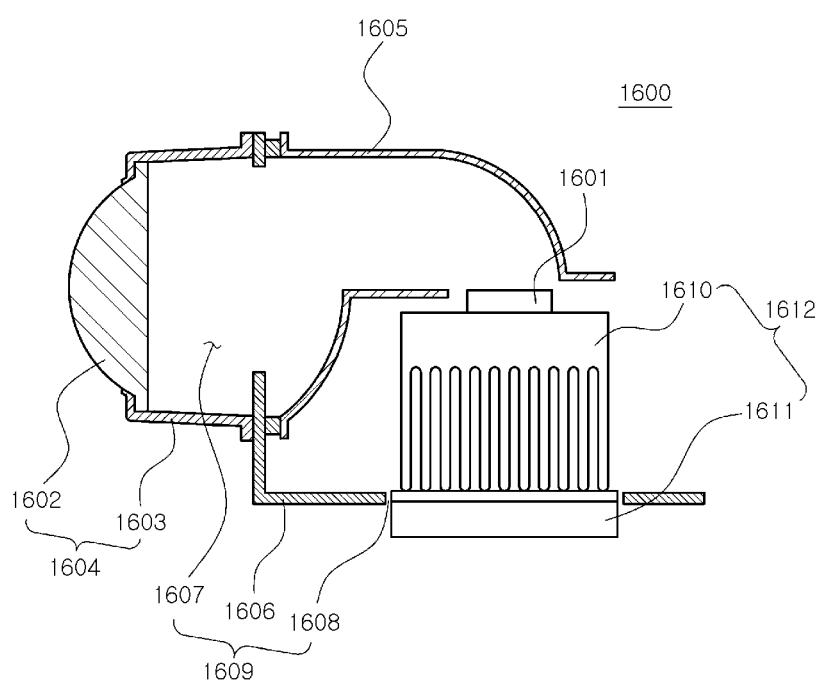
FIG. 16 is a view illustrating an exemplary application of a semiconductor light emitting device of the present disclosure to a headlamp.

FIG. 16 is a view illustrating an example of application of a semiconductor light emitting device according to an exemplary embodiment of the present disclosure to a headlamp.

Referring to FIG. 16, a headlamp 1600 used as a vehicle lamp, or the like, may include a light source 1601, a reflective unit 1605, and a lens cover unit 1604. The lens cover unit 1604 may include a hollow guide 1603 and a lens 1602. The headlamp 1600 may further include a heat dissipation unit 1612 outwardly dissipating heat generated by the light source 1601. In order to effectively dissipate heat, the heat dissipation unit 1612 may include a heat sink 1610 and a cooling fan 1611. Also, the headlamp 1600 may further include a housing 1609 fixedly supporting the heat dissipation unit 1612 and the reflective unit 1605, and the housing 1609 may have a central hole 1608 formed in one surface thereof, in which the heat dissipation unit 1612 is coupled. Also, the housing 1609 may have a front hole 1607 formed in the other surface integrally connected to the one surface and bent in a right angle direction to allow the reflective unit 1605 to be fixedly positioned above the light source 1601. Accordingly, the front side is opened by the reflective unit 1605, and the reflective unit 1605 is fixed to the housing 1609 such that the open front side corresponds to the front hole 1607 and light generated by the light source 1601 is reflected thereby to pass through the front hole 1607 to be output outwardly.

As set forth above, in the case of the semiconductor light emitting device according to exemplary embodiments of the present disclosure, internal quantum efficiency may be enhanced to improve luminance, and even in the case that an active layer includes a large number of pairs of quantum well layer and quantum barrier layer, a degradation of thin film crystallinity of the active layer may be prevented or reduced and droop characteristics due to heating when the semiconductor light emitting device operates may be improved.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A semiconductor light emitting device comprising:
    an n-type semiconductor layer;
    a p-type semiconductor layer; and
    an active layer disposed between the n-type semiconductor layer and the p-type semiconductor layer, and including a plurality of alternately stacked quantum barrier layers and quantum well layers,
    wherein at least a portion of the plurality of quantum well layers has different thicknesses, and
    wherein a thickness of a first quantum well layer most adjacent to the p-type semiconductor layer is less than a thickness of a second quantum well layer adjacent to the first quantum well layer and greater than a thickness of a third quantum well layer, other than the first and second quantum well layers.

2. The semiconductor light emitting device of claim 1, wherein the third quantum well layer is a plurality of third quantum well layers, and thicknesses of each of the plurality of third quantum well layers are increased in a direction toward the p-type semiconductor layer.

3. The semiconductor light emitting device of claim 2, wherein the plurality of quantum barrier layers and the plurality of quantum well layers form m number of pairs, where m is an integer equal to or greater than 2.

4. The semiconductor light emitting device of claim 3, when m is an odd number, an ((m−1)/2)th pair of quantum well and quantum barrier layers from the n-type semiconductor layer have a minimum thickness difference, and when m is an even number, an (m/2)th pair of quantum well and quantum barrier layers from the n-type semiconductor layer have a minimum thickness difference.

5. The semiconductor light emitting device of claim 3, when m is an odd number, the quantum barrier layer and quantum well layer forming an ((m−1)/2)th pair from the n-type semiconductor have a substantially equal thickness to each other, and when m is an even number, the quantum barrier layer and quantum well layer forming an (m/2)th pair from the n-type semiconductor layer have a substantially equal thickness to each other.

6. The semiconductor light emitting device of claim 3, wherein a thickness ratio of each of the quantum well layers and quantum barrier layers forming the m number of pairs ranges from 0.5 to 1.8.

7. The semiconductor light emitting device of claim 1, wherein a difference between a maximum value and a minimum value of thicknesses of each of the plurality of quantum well layers ranges from 0.7 nm to 3.0 nm.

8. The semiconductor light emitting device of claim 1, further comprising a superlattice layer disposed between the active layer and the n-type semiconductor layer.

9. The semiconductor light emitting device of claim 1, wherein the plurality of quantum well layers and the plurality of quantum barrier layers are formed of $Al_xIn_yGa_{1-x-y}N$ ($0 \leq x < 1$, $0 < y \leq 1$).

10. The semiconductor light emitting device of claim 9, wherein compositions of indium (In) of the plurality of quantum well layers are gradually increased from the n-type semiconductor layer in the lamination direction.

11. The semiconductor light emitting device of claim 9, wherein an amount of indium (In) in the first quantum well layer is smaller than or equal to that of the second quantum well layer and greater than or equal to that of the third quantum well layer.

12. The semiconductor light emitting device of claim 1, wherein thicknesses of each of the plurality of quantum barrier layers are substantially equal.

13. The semiconductor light emitting device of claim 1, wherein the p-type semiconductor layer is doped with a p-type impurity including at least one of magnesium (Mg) and zinc (Zn).

14. A semiconductor light emitting device comprising:
   an n-type semiconductor layer;
   an active layer disposed on the n-type semiconductor layer and including m number of pairs formed by a plurality of alternately stacked quantum well layers and quantum barrier layers; and
   a p-type semiconductor layer disposed on the active layer,
   wherein when m is an odd number, an ((m−1)/2)th pair of quantum well and quantum barrier layers from the n-type semiconductor layer have a minimum thickness difference, and when m is an even number, (m/2)th pair of quantum well and quantum barrier layers from the n-type semiconductor layer have a minimum thickness difference.

15. The semiconductor light emitting device of claim 14, wherein a thickness of a quantum well layer included in an mth pair from the n-type semiconductor layer is smaller than or equal to a thickness of a quantum well layer included in an (m−1)th pair from the n-type semiconductor layer or greater than or equal to a thickness of a quantum well layer included in (m−2)th pair from the n-type semiconductor layer.

16. A semiconductor light emitting device comprising:
   an n-type semiconductor layer;
   a p-type semiconductor layer; and
   an active layer disposed between the n-type semiconductor layer and the p-type semiconductor layer, and including alternately stacked quantum barrier layers and quantum well layers,
   wherein thickness of the quantum well layers increases in a direction away from the n-type semiconductor layer and toward the p-type semiconductor layer.

17. The semiconductor light emitting device of claim 16, wherein a composition of indium included in the quantum well layers increases in the direction away from the n-type semiconductor layer and toward the p-type semiconductor layer.

18. The semiconductor light emitting device of claim 16, wherein a first quantum well layer most adjacent to the p-type semiconductor layer has a thickness less than a thickness of a second quantum well layer adjacent to the first quantum well layer and greater than a thickness of a third quantum well layer, other than the first and second quantum well layers.

19. The semiconductor light emitting device of claim 16, wherein the quantum barrier layers and the quantum well layers form m number of pairs, where m is an integer equal to or greater than 2.

20. The semiconductor light emitting device of claim 19, when m is an odd number, an ((m−1)/2)th pair of quantum well and quantum barrier layers from the n-type semiconductor layer have a minimum thickness difference, and when m is an even number, an (m/2)th pair of quantum well and quantum barrier layers from the n-type semiconductor layer have a minimum thickness difference.

* * * * *